United States Patent [19]

Okamoto et al.

[11] Patent Number: 4,879,687

[45] Date of Patent: Nov. 7, 1989

[54] MEMORY DEVICE HAVING VALID BIT STORAGE UNITS TO BE RESET IN BATCH

[75] Inventors: Tadashi Okamoto, Hirakata; Hiroshi Kadota, Toyonaka; Jiro Miyake, Moriguchi; Ichiro Okabayashi; Yoshinori Maeda, both of Hirakata, all of Japan

[73] Assignee: Matsushita Electric Industrial Co., Ltd., Osaka, Japan

[21] Appl. No.: 59,763

[22] Filed: Jun. 8, 1987

[30] Foreign Application Priority Data

Jun. 13, 1986 [JP] Japan ............................ 61-138529

[51] Int. Cl.[4] .................... G11C 7/00; G11C 11/40
[52] U.S. Cl. ....................... 365/200; 365/230.03; 365/218; 365/189.01; 365/49
[58] Field of Search ............... 365/189, 49, 230, 200, 365/218, 203, 222, 154; 364/200, 900; 371/21

[56] References Cited

U.S. PATENT DOCUMENTS 4,244,033  1/1981  Hattori ........................... 365/49 X
4,390,946  6/1983  Lane ............................. 365/230 X
4,689,772  8/1987  Jordy ............................ 365/201

Primary Examiner—Stuart N. Hecker
Assistant Examiner—Alyssa H. Bowler
Attorney, Agent, or Firm—Wenderoth, Lind & Ponack

[57] ABSTRACT

A memory device includes plural word data storing rows. Each word data storing row is composed of a plurality of data bit cells for storing the word data, and a valid bit cell for indicating the validity of data. The valid bit cell has a reset circuit composed of FETs, and the reset circuits are connected to one reset line. By applying a reset signal to one reset line, plural valid bit cells are reset as a batch.

5 Claims, 6 Drawing Sheets

MEMORY DEVICE HAVING VALID BIT STORAGE UNITS TO BE RESET IN BATCH

BACKGROUND OF THE INVENTION

This invention relates to a memory device having valid bit storage units which are reset in batch.

Conventionally, in some of the memory devices, a valid bit storage unit was disposed at the head of the storage unit of data to be stored. That is, by placing a valid bit at the head of each word as the data to be stored, it is designed to indicate whether the subsequent word data is valid or invalid depending on whether that valid bit is 1 or 0. The memory device having such valid bit storage unit is used, for example, when simplifying the data control by hardware structure as disclosed in a constitution example of cache memory on page 138 of "Hardware of Microcomputer" of Iwanami Lecture on Microelectronics 5. Furthermore, on the same word as the data, a status bit storage unit for indicating the data control information may be provided.

In such conventional valid bit devices, however, if there are many unnecessary words in the stored word data depending on the changes in the status of the processing unit for executing the data, all data words were accessed, and the status bit storage unit and valid bit of each word were checked to judge unnecessary data words, and the valid bit of each word was rewritten to invalidate the unnecessary data.

In this method, if there are many unnecessary words, since accessing to the memory device and all words to be erased should be necessary, it becomes an extreme overload to the system including the memory circuit. Or, when erasing the words, it may be possible to set the data word line of all words at high potential and invalidate the valid bits, but in this case, necessary data may be erased together with unnecessary data.

SUMMARY OF THE INVENTION

It is hence a primary object of this invention to present a memory device capable of resetting in batch the plural valid bit storage units by small addition of hardware.

It is another object of this invention to present a memory device capable of resetting selectively and in batch the plural valid bit storage units with small addition of hardware depending on the state of the status bit storage unit on a same word.

These and other objects are accomplished by a memory device having plural word data storage units, with each word data storage unit comprising plural data bit cells for storing word data and a valid bit cell for storing valid bits to indicate the validity of said data, in which said valid bit cell has a reset circuit, and the reset circuit of each word data storage unit is connected to one reset line, whereby plural valid bit cells are reset in batch by applying a reset signal to said one reset line.

This invention also relates to a memory device having plural word data storage units, with each word data storage unit comprising plural data bit cells for storing word data, a status bit cell for indicating the status of said data, and a valid bit cell for storing the valid bits to indicate the validity of said data, in which said valid bit cell has a reset circuit, and this reset circuit is connected to one reset line and is connected, only when the output of status bit cell is of specified status, to a status setting circuit capable of operating the reset circuit, whereby when a reset signal is applied to said one reset line only the valid bit cell in the word data storage unit where the output of status bit cell is in specified status is reset in batch.

According to the present invention as described herein, the following benefits, among others, are obtained: that is, by using the memory circuit of this invention, plural unnecessary data can be erased in a short time, selectively, and easily. This memory device is particularly effective when the system scale is extended in the future and memory circuits are used in quantities.

While the novel features of the invention are set forth with particularly in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
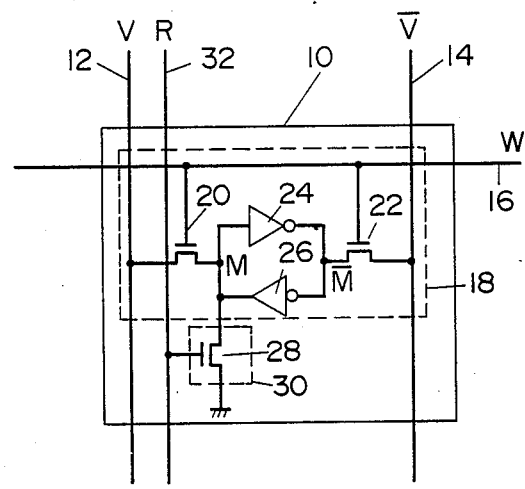
FIG. 1 is a circuit diagram of valid bit cell composing a memory device in a first embodiment of this invention.
Figure 2:
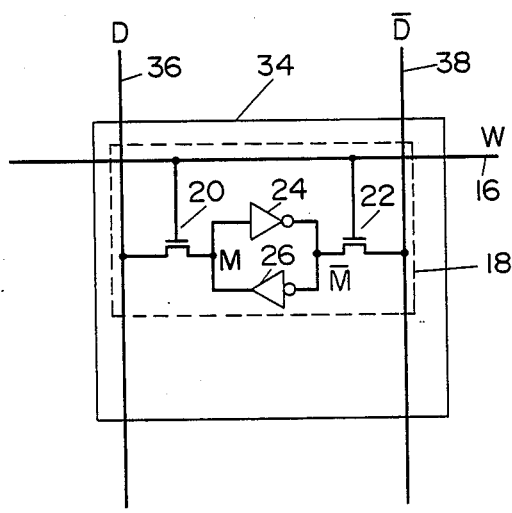
FIG. 2 is a circuit diagram of a data bit cell composing the same memory device.
Figure 3:
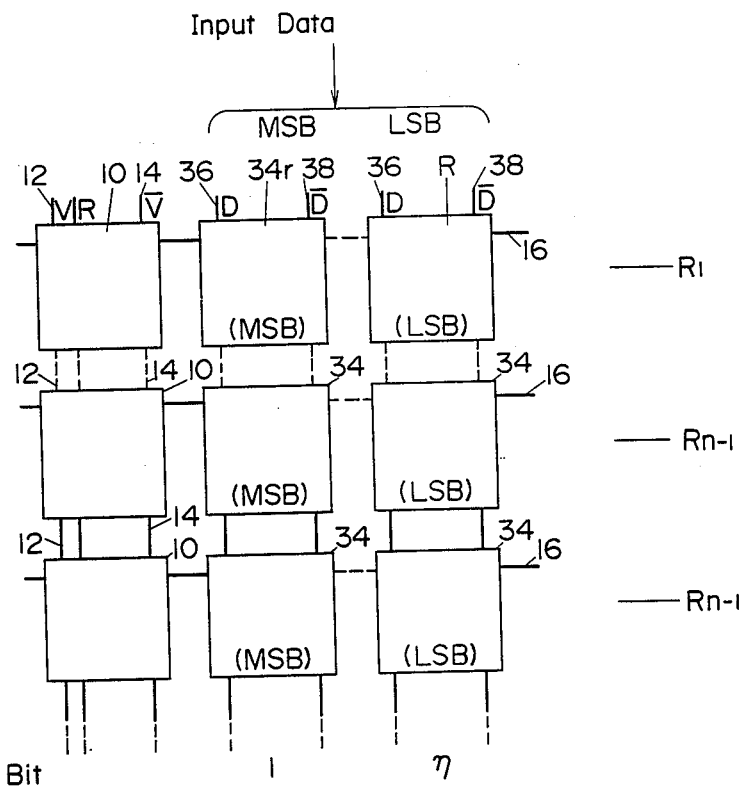
FIG. 3 is a block diagram of the same memory device.

Referring now to FIGS. 1 to 3, one of the embodiments of this invention is described below. FIG. 1 illustrates a valid bit cell with a reset function of a memory device. This valid bit cell is represented by numeral 10. The valid bit data to be stored in this cell 10 is fed through a pair of valid bit lines 12, 14. Complementary signals, V, $\overline{V}$ appear on the valid bit lines 12, 14. A word line 16 is crossing the valid bit lines 12, 14. A memory cell 18 composed of static random access memory (SRAM) is disposed in the cross portion between the valid bit lines 12, 14 and word line 16. The memory cell 18 delivers stored data M, $\overline{M}$. A word signal W appears on the word line 16. The memory cell 18 is composed of two field effect transistors (FETs) 20, 22, and two inverters 24, 26.

In addition to said memory cell 18, the valid bit cell 10 contains a reset circuit 30 composed of N-channel FET 28. That is, the source and drain of FET 28 are connected between the connecting point of inverters 24, 26 and FET 20 (that is, the point where stored data M appears), and the earth. The gate of this FET 28 for reset is connected to a batch reset line 32.

FIG. 2 refers to a data bit cell of the same memory device. This data bit cell is represented by numeral 34. The data to be stored in this data bit cell is fed into a cell 34 by way of a pair of data bit lines 36, 38. Complementary signals D, $\overline{D}$ appear on the data bit lines 36, 38. The word line 16 is same as the word line 16 in FIG. 1, and it is crossing the data bit lines 12, 14. This data bit cell contains a memory cell composed of SRAM, and this cell is identical with the memory cell 18 shown in FIG.

1, and is given a same number and its detailed description is omitted.

FIG. 3 is a block diagram of the memory cell containing valid bit cells which are reset in batch. The memory device is composed of a plurality of cells 10, 34. The cells are disposed in matrix manners (row×column). One row of cells is composed of one valid bit cell 10 and a plurality of data bit cell 34 wherein valid bit cell 10 is positioned at the top of the row, and is disposed in the direction of word line 16.

Referring to FIGS. 1 and 2, V, $\overline{V}$ or D, $\overline{D}$ as input data are complementary voltages which are applied in case of SRAM writing operation, etc. and M, $\overline{M}$ as stored data are complementary voltages. In case that writing operation is carried out to cell 10 or 34, MOS FETs 20, 22 of memory cell 18 are turned ON so that electric potential on bit line 12 (V) or 36 (D) is written into memory cell 18 as M and electric potential on bit line 14 ($\overline{V}$) or 38 ($\overline{D}$) is written into memory cell 18 as $\overline{M}$.

Back to FIG. 3, as stated above, one row R1 . . . , Rn−1 or Rn is composed of the beginning valid bit cell 10 and its subsequent plurality of data bit cells 34, and one row stores one word. That is, the data bit cells 34 to make up one row are sequentially disposed, from left to right as shown in the drawing, from the MSB to the LSB, and a plurality of data bits to make up one word are individually stored. In the valid bit cell 10, "1" is stored if the data of subsequent data bit cell 34 is needed, and "0" is stored if not.

In such memory device, if all data stored in the memory device come to be unnecessary, a reset signal is applied to the batch reset signal line, and all N-channel FETs 28 to make up the reset circuit 30 of valid bit cell 10 of each row are turned on, and valid bits are set to "0" in batch, so that the unnecessary data can be erased in batch. Instead of the above N-channel FETs 28, it is evident that P-channel FETs may be similarly used if the polarity is changed over.

Figure 4:
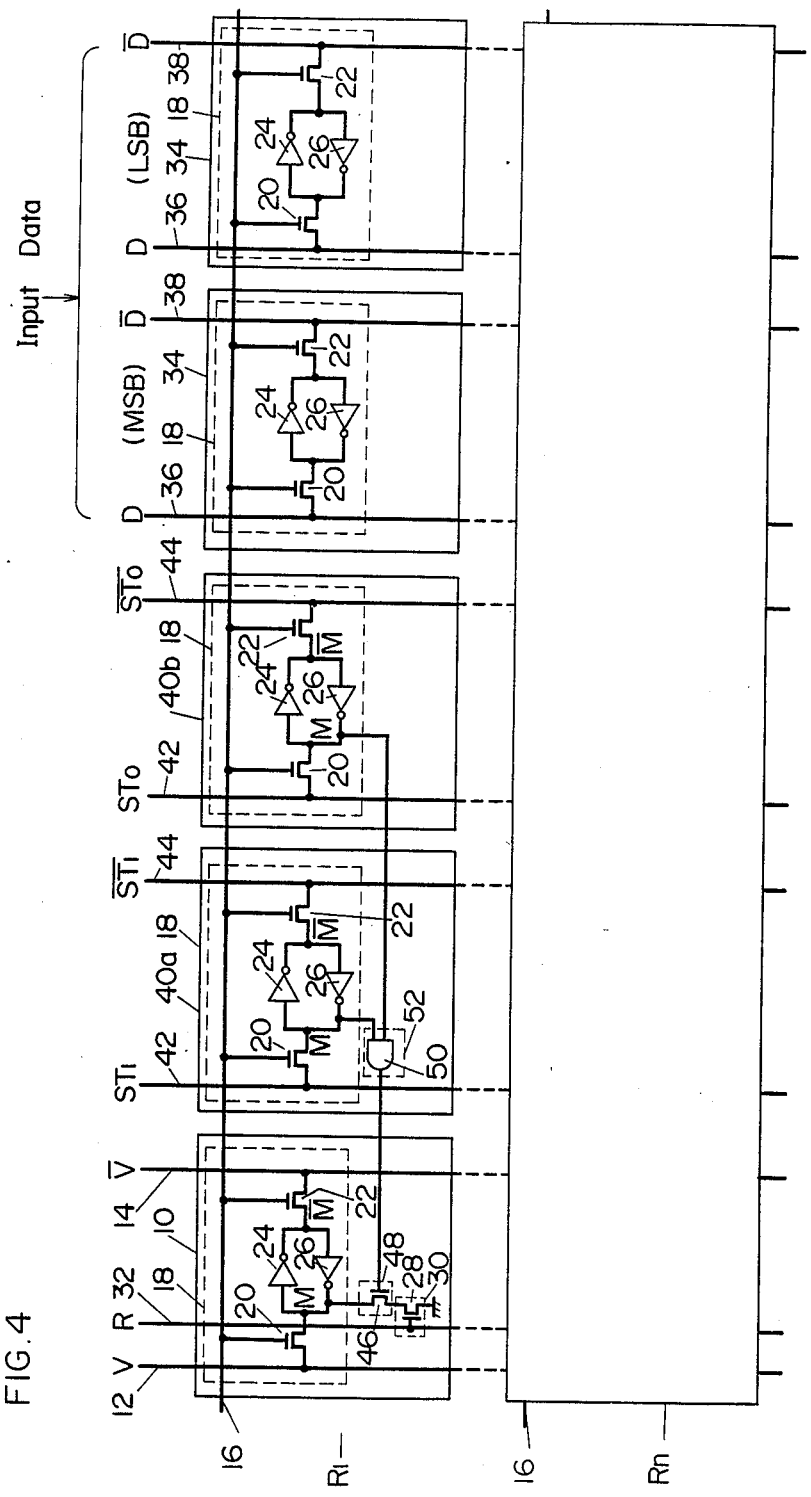
FIG. 4 is a schematic circuit diagram of a memory device in a second embodiment of this invention.

FIG. 4 shows a second embodiment of this invention. The memory device in this embodiment, as clear from comparison between FIG. 4 and FIG. 3, is basically same as the device of the first embodiment. What differs is that two status bit cells 40 to indicate the data status are disposed between the beginning valid bit cell 10 of each row and the subsequent data bit cell 34. This status bit also corresponds to an ID (identification) bit. These status bit cells 40 are basically same as the data bit cell 34 in construction, in which status bit data ST1, $\overline{ST1}$, or ST0, $\overline{ST0}$ to be applied to a pair of status bit lines 42, 44 are stored in the memory cell 18. In the valid bit cell 10, furthermore, a second reset circuit 48 composed of N-channel FET 46 is connected between said reset circuit 30 and stored data M output point. To the gate of this FET 46, the output M of first and second status bit cells 40a, 40b is applied by way of status setting circuit 52 composed of AND circuit 50.

Namely, to the gate of N-channel FET 46, the output from status bit cells 40a, 40b provided for each word is applied, and it is designed to turn on this N-channel FET 46 only in a certain status. Here, for example, when the status bit cells 40a, 40b are both ON (M is "1"), when a reset signal is applied to the line 32, the FETs 28, 46 are both turned on, and the valid bit cell 10 is reset.

Accordingly, by applying a reset signal to the batch reset line 32, only the valid bit cell 10 in a certain state (here, both status bit cells are ON) can be cleared, and since this operation is applied to all rows having the same status, the data having a same status bit can be erased in batch.

Figure 5:
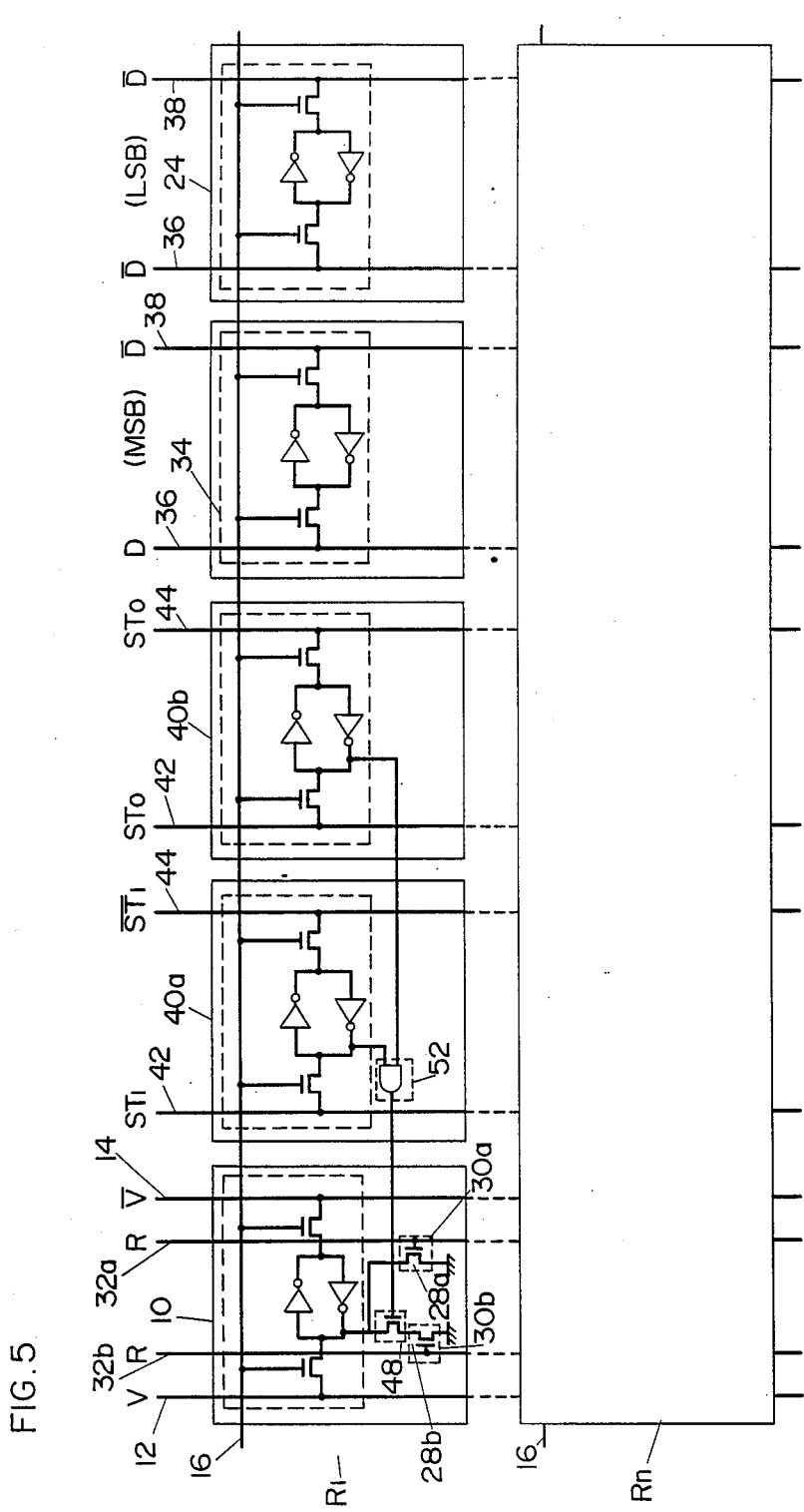
FIG. 5 is a schematic circuit diagram of a memory device in a third embodiment of thereof.

FIG. 5 refers to a third embodiment combining the first and second embodiments. In this case, the data can be reset either in a specific status as in the second embodiment or unconditionally as in the first embodiment. Detailed description is omitted because it is same as in the first and second embodiments.

Figure 6:
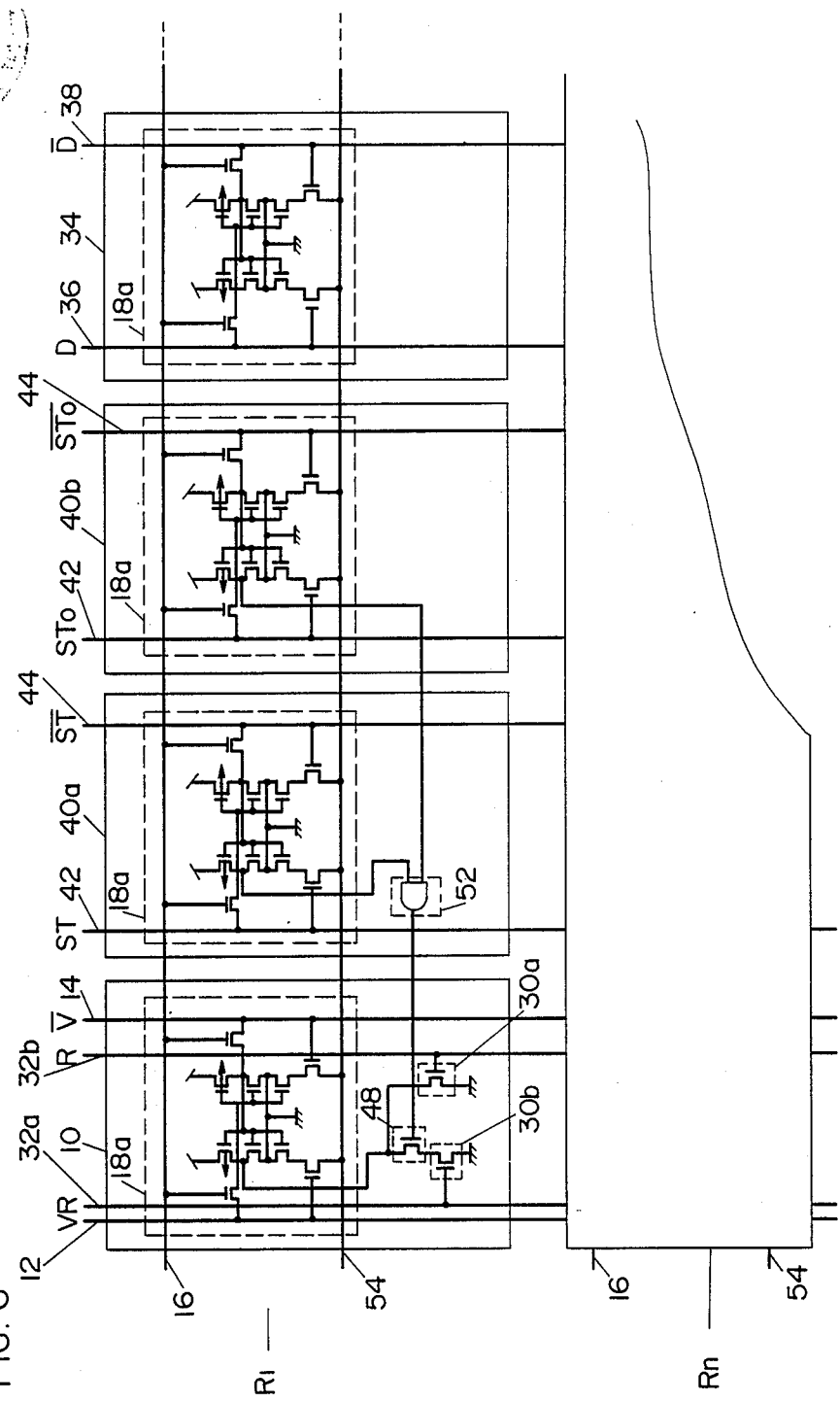
FIG. 6 is a schematic circuit diagram of a memory device in a fourth embodiment thereof.

In FIG. 6, a content addressable memory is used, in the third embodiment, as memory cell 18, instead of a general random access memory. The content addressable memory is indicated by 18 a. Numeral 54 denotes a CAM bit word line. The operation is same as this embodiment and is not described here.

Figure 7:
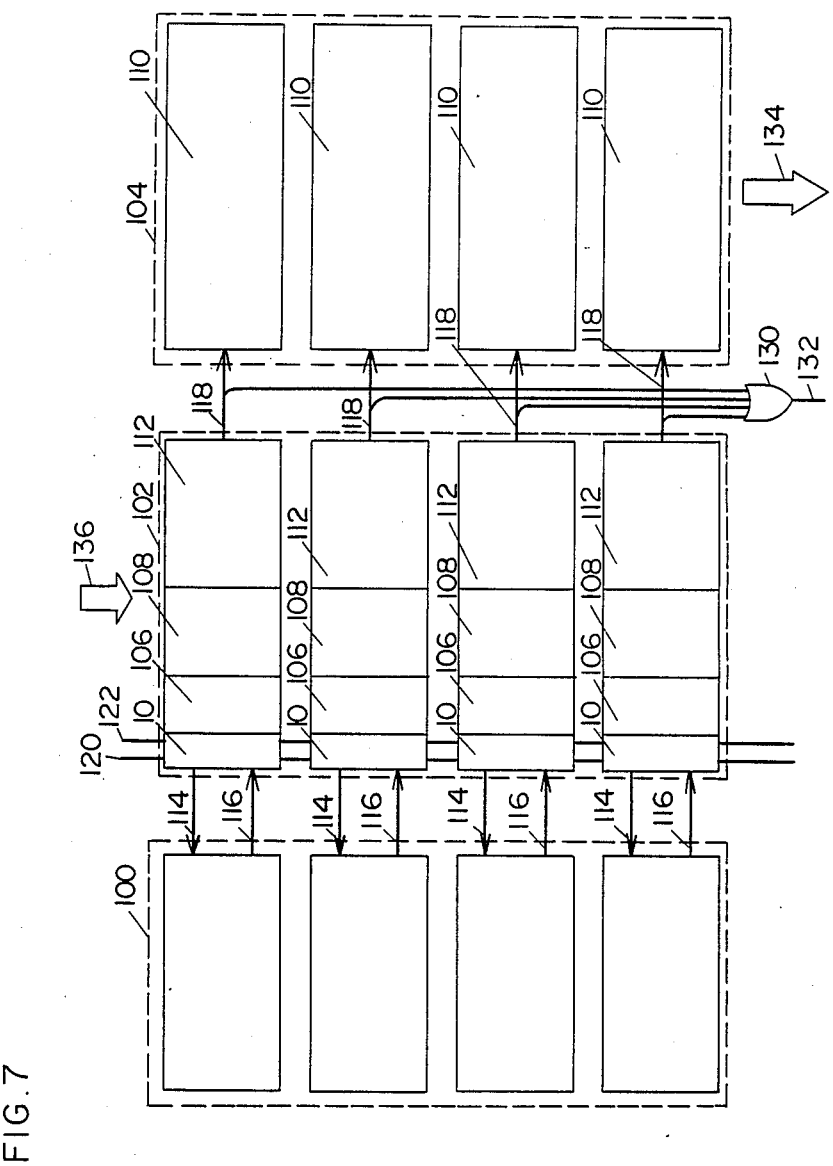
FIG. 7 is a block diagram of a memory system using this invention.

FIG. 7 shows an example of execution of a memory device, by using the content addressable memory shown in FIG. 6, for batch resetting of all words unconditionally by this invention.

In this drawing, numeral 100 denotes a replace control system for changing over and controlling the data to be held in the memory system by referring to valid bit signal 114 from valid bit cell 10, 102 is a CAM composed of the structure shown in FIG. 6 for searching by the signal line indicating the address of 136, 104 is SRAM for the converted physical address, 108 is tag I (status bit portion) made of 2 bits to indicate the identification number of the process provided for supporting the multiprocess, 106 is a status setting circuit assembled so as to erase in the operation shown in FIG. 6 the process identification numbers of 0 to 3, because tag I is composed of 2 bits here, with respect to all statuses of tag I, 110 is a data storage unit for composing SRAM 104, 112 is tag II for storing other tags than the identification number of process and including the address information searched by the signal line 136 of address, 118 is a word line for specifying the word when reading or writing data 110 of SRAM 104, 130 is a judging circuit for judging if there is any corresponding data or not as a result of search for the signal line 136 of address entering the CAM, 132 is CAM search bit signal from the judging circuit 130, 134 is data read out from SRAM, and 116 denotes address signal lines, comprising the word lines specified in CAM 102 by determining the word to be replaced by the replace judging circuit 100 when there is not corresponding data when the CAM 112 is searched, 120 is a batch reset line for specifying to reset in batch the valid bits with respect to all words, and 122 is batch reset lines made of four lines for specifying batch reset selectively with respect to each status by referring to the information 0 to 3 of tag I (status bit portion) made of 2 bits of the same word.

This memory system usually operates as follows.

(i) Receiving an address signal line 136 containing address and process identification number, it is searched if there is any word having valid bit and identical information in the CAM 102.

The operation after searching may involve two possibilities.

(ii-a) If the searched data is found on the memory system, the word of the corresponding data is transmitted from the CAM 102 to SRAM 104 by using the read line 118, and valid data is read out from the SRAM 104.

(ii-b) If the searched data is not found on the memory system, since the CAM search bit signal from the judging circuit 130 indicates a miss hit on the CAM 102, the valid data is accessed from above an external main memory, and written into the CAM 102, SRAM 104 with respect to the word indicated by the replace control unit 110, thereby exchanging the data.

Since this operation is a well-known action, general publications of TLB may be referred to (e.g., Chapter 11 "Contente addressable memory, TLB" of Programming and Architecture, published by CQ Shuppansha).

The operation of this invention in the memory system is described below.

When starting up the memory system, the valid bit cell 10 on the CAM 102 contains valid words although the data of all words are invalid. Therefore, when starting up the memory system, by applying a reset signal to the batch reset terminal 120, the memory system may be initialized easily in a short time, in batch.

Then, as mentioned above, the memory system repeats storing data into the CAM 102 and SRAM 104 according to the usual operation procedure. If this memory system is composed of four words, data exchange is necessary when handling data for a larger number.

If, for one example, data fills up all four words of the memory system, any weighted word is forced out, but there is a possibility that words of other unnecessary process may be left over in the memory system, and the memory system cannot be used effectively without considering this point. This invention is hence intended to use the memory system effectively by tidying up the contents in the memory system, by selectively resetting the valid bits of the words in which data of other process than the one being executed at the present is stored, that is, by applying a reset signal to the batch reset terminal 122 other than the process being executed at the present.

For another example, this memory system has two status bit cells to distinguish four different processes. So if processes are changed among these four processes, it is not necessary to invalidate words of any process. But if fifth process comes, words of some processes must be invalidated. This invention enables to invalidate the words of only one process selectively in batch. It is much more effective in multiprocess environments than invalidation of all words.

As for the method of replace control part of 100, by referring to the valid bit, the replace word is determined by priority, and it does not relate to the method in which all words are filled with data.

The above idea can be applied for a cache as well as a TLB.

While specific embodiments of the invention have been illustrated and described herein, it is realized that other modifications and changes will occur to those skilled in the art. It is therefore to be understood that the appended claims as fall within the true spirit and scope of the invention.

What is claimed is:

1. A memory device comprising plural word data storage units, each word data storage unit having plural data bit cells for storing word data, a plurality of status bit cells for indicating the status of said data, and a valid bit cell storing valid bits for indicating the validity of said data, said valid bit cell having a reset circuit, and said reset circuit being connected to one reset line and connected to a status setting circuit capable of operating the reset circuit only when the outputs of status bit cells having a specified status, whereby only the valid bit cell of the word data storage unit in which the output of status bit cell has a specified status when a reset signal is applied to one reset line being reset in batch, said reset circuit comprising first and second switches composed of transistors for connecting in series between a portion holding the data of memory cells of said valid bits and a constant potential portion; wherein said status setting circuits disposed on all words receive outputs from said status bits on individual words to generate an output used as the input to said first switch, and wherein said one reset line is used as an input to said second switch for all words.

2. A memory device comprising plural word data storage units, each word data storage unit having plural data bit cells for storing word data, a plurality of status bit cells for indicating the status of said data, and a valid bit cell for storing valid bits for indicating the validity of said data, each valid bit cell being composed of one memory cell, a pair of valid bit lines, and a word line, and a reset circuit composed of first and second field effect transistors connected in series and connected between an output of said memory cell and ground, wherein status setting circuits for receiving outputs from said status bits and generating an output are disposed on all words, and wherein a gate of said first transistor is connected to the reset line and the gate of said second transistor to said output of said status setting circuit.

3. A memory device as in claim 2, wherein said memory cell is an AND circuit.

4. A memory device as in claim 2, wherein said memory cell is a SRAM.

5. A memory device as in claim 2, wherein said memory cell is a CAM.